(12) United States Patent
Lu et al.

(10) Patent No.: US 7,743,925 B1
(45) Date of Patent: Jun. 29, 2010

(54) RETICLE POD

(75) Inventors: Pao-Yi Lu, Shulin (TW); Chin-Ming Lin, Shulin (TW)

(73) Assignee: Gudeng Precision Industral Co. Ltd, Shulin (TW)

( * ) Notice: Subject to any disclaimer, the term of this patent is extended or adjusted under 35 U.S.C. 154(b) by 0 days.

(21) Appl. No.: 12/339,132

(22) Filed: Dec. 19, 2008

(30) Foreign Application Priority Data

Dec. 5, 2008 (TW) ............................... 97147258 A (51) Int. Cl.
  B65D 85/00 (2006.01)
  B65D 45/16 (2006.01)
  A45C 13/10 (2006.01)

(52) U.S. Cl. ..................... 206/710; 206/1.5; 220/326
(58) Field of Classification Search ............... 206/1.5, 206/171, 454, 455, 710, 711, 724; 220/324, 220/326, 345.3, 835; 355/72, 75
See application file for complete search history.

(56) References Cited

U.S. PATENT DOCUMENTS

| | | | | |
|---|---|---|---|---|
| 3,615,006 | A * | 10/1971 | Freed | 206/454 |
| 4,681,221 | A * | 7/1987 | Chickanosky et al. | 206/719 |
| 5,353,946 | A * | 10/1994 | Behrend | 220/326 |
| 5,427,265 | A * | 6/1995 | Cautereels et al. | 220/318 |
| D383,306 | S * | 9/1997 | Pennoyer | D3/294 |
| 5,848,703 | A * | 12/1998 | Murphy et al. | 206/725 |
| D418,978 | S * | 1/2000 | Pennoyer, Jr. | D3/273 |
| 6,216,873 | B1* | 4/2001 | Fosnight et al. | 206/710 |
| 7,209,220 | B2 | 4/2007 | Puerto et al. | |
| 7,304,720 | B2 | 12/2007 | del Puerto et al. | |
| 7,420,655 | B2 | 9/2008 | Matsutori et al. | |
| 7,450,219 | B2* | 11/2008 | Matsutori et al. | 355/75 |
| 7,528,936 | B2* | 5/2009 | Gregerson et al. | 355/72 |
| 2003/0089313 | A1* | 5/2003 | Ham et al. | 118/500 |
| 2006/0109449 | A1* | 5/2006 | Matsutori et al. | 355/75 |
| 2006/0201958 | A1* | 9/2006 | Tieben et al. | 220/835 |
| 2006/0237338 | A1 | 10/2006 | Nakamae | |
| 2006/0260978 | A1* | 11/2006 | Gregerson et al. | 206/710 |

FOREIGN PATENT DOCUMENTS

| | | |
|---|---|---|
| TW | 221824 | 10/2004 |
| TW | 227210 | 2/2005 |
| TW | 246106 | 12/2005 |

\* cited by examiner

*Primary Examiner*—Ehud Gartenberg
*Assistant Examiner*—Kaushikkumar Desai
(74) *Attorney, Agent, or Firm*—Ming Chow; Sinorica, LLC (57) ABSTRACT

A reticle pod, comprising an upper cover having a first accommodating space and a lower cover having a second accommodating space, a third accommodating space being formed after the upper cover and the lower cover close together, wherein the characteristic of the reticle pad is in that: the reticle pod includes a plurality of supporting pieces respectively and suspendingly disposed at each corner of the inner surfaces of the upper cover and of the lower cover, and two ends of each of the plurality of supporting pieces are respectively connected to two neighboring sides of corner of the inner surface to form a closed sheet body and a gap is formed at the bend of the closed sheet body.

15 Claims, 14 Drawing Sheets

RETICLE POD

BACKGROUND OF THE INVENTION

1. Field of the Invention

The present invention is related to a reticle pod, and more particularly, to a reticle pod with a plurality of supporting pieces respectively and suspendingly disposed at each corner of the inner surface of the upper cover and the lower cover for ensuring the stability of the photomask stored in the reticle pod and preventing from unnecessary collisions that will lead to displacement or damage of the photomask stored in the reticle pod.

2. Description of the Prior Art

In the rapidly developing semiconductor technology, optical lithography plays an important role and wherever pattern definition is conducted, optical lithography is requisite. In the application of optical lithography relating to semiconductors, a designed circuit pattern is used to produce a light-transparent photomask with a particular shape. With the principle of exposure as basis, after a light source passes through the photomask to project on a silicon wafer, the circuit pattern formed on the photomask can be exposed onto the silicon wafer. Since any dust (such as particles, powders or organic matters) can cause negative impact on the quality of such projected pattern, the photomask used to produce the pattern is required to be kept with absolute cleanness, and therefore in ordinary wafer process, clean room environment is provided to prevent from contamination of particles in the air. However, the status of absolute cleanliness still cannot be achieved in the clean room currently in use. At present, anti-contamination reticle pod is used in the semiconductor process for storing and transporting the photomask to ensure the cleanliness of the photomask.

However, when the reticle pod is used to store and transport the photomask, a plurality of supporting pieces need to be disposed in the reticle pod for supporting and propping up the photomask. When the photomask is placed in the reticle pod for storage, the supporting pieces are in direct contact with the photomask and therefore friction between the supporting pieces and the photomask occur more easily and will then generate static electricity that leads to damage of the photomask; when the photomask is placed in the reticle pod for being transported, the vibration generated in the transporting process will cause damage or crack of the photomask more easily. How to provide the supporting pieces with both the merit of resistance to damage from static electricity and the merit of anti-vibration thus becomes a critical subject.

SUMMARY OF THE INVENTION

In view of the aforementioned problems, one objective of the present invention is to provide a reticle pod with a plurality of supporting pieces for ensuring the stability of the photomask stored in the reticle pod and preventing from unnecessary collisions that will lead to displacement or damage of the photomask stored in the reticle pod.

Another objective of the present invention is to provide a reticle pod, the supporting pieces of which prop up to the crest line of the photomask stored therein when the upper cover and the lower cover close together to reduce the contact area between the supporting pieces and the photomask for preventing the photomask from being damaged.

Still another objective of the present invention is to provide a reticle pod, the supporting pieces, lock-fastener, and connection portion of which are integrated in manufacturing process; therefore not only a simpler structure is provided, but the number of pieces is also decreased to reduce time and cost spent in assembling the pieces.

Yet another objective of the present invention is to provide a reticle pod, the supporting pieces of which are suspendingly disposed in the reticle pod for being elastic and able to absorb the vibration generated when the reticle pod is transported to provide the photomask with a protective buffering effect.

And still another objective of the present invention is to provide a reticle pod, on the supporting pieces of which are formed with a pair of fin portions that contact sides of the photomask to increase the supportive force for the photomask of the supporting pieces in lateral direction.

And yet another objective of the present invention is to provide a reticle pod that further comprises a sealed ring for equipping the reticle pod with better effect of air tightness.

And still another objective of the present invention is to provide a reticle pod, the structure of lock-fastener of which allows the covers of the reticle pod to be able to have both the functions of opening easily and closing tightly together to achieve a lock-fastening effect.

And yet another objective of the present invention is to provide a reticle pod, the design of the first protruding edge and the second protruding edge of which allows the reticle pod to be stackable for reducing space needed for storing the reticle pod, the first protruding edge and the second protruding edge holding up and pinning down each other to prevent the stacked reticle pod from slanting or toppling due to collision.

And still another objective of the present invention is to provide a reticle pod, thickness of the upper cover of which and thickness of the lower cover of which are equivalent to ensure the reticle pod can be stably and flatly placed on the surface of table.

And yet another objective of the present invention is to provide a reticle pod that comprises symmetrical foot stands for the reticle pod to be erectly placed on the surface of table.

And still another objective of the present invention is to provide a reticle pod disposed with barrier for placing name plate or bar code, wherein the design of the barrier prevents the name plate or bar code from dropping when the reticle pod is placed upside down.

According to above objectives, the present invention provides a reticle pod, comprising an upper cover with a first accommodating space and a lower cover with a second accommodating space, said upper cover and said lower cover each having an outer surface and an inner surface, a third accommodating space being formed after the upper cover and the lower cover closing together, wherein characteristic of the reticle pod is in that: the reticle pod includes a plurality of supporting pieces respectively and suspendingly disposed at each corner of the inner surfaces of the upper cover and of the lower cover, and two ends of each of the plurality of supporting pieces are respectively connected to two neighboring sides of corner of the inner surface to form a closed sheet body and a gap is formed at the bend of the closed sheet body; when a photomask is stored in the third accommodating space of the reticle pod, the four corners of the photomask are placed in the gaps of the supporting pieces, and when the upper cover and the lower cover close together, the supporting pieces prop up to the crest line of the photomask for ensuring the stability of the photomask and preventing from unnecessary collisions that will lead to displacement or damage of the photomask.

BRIEF DESCRIPTION OF THE DRAWINGS

The invention as well as a preferred mode of use, further objectives and advantages thereof, will best be understood by reference to the following detailed description of an illustrative embodiment when read in conjunction with the accompanying drawings, wherein.

DESCRIPTION OF THE PREFERRED EMBODIMENTS

The present invention discloses a reticle pod, and more particularly, a reticle pod with a plurality of supporting pieces respectively and suspendingly disposed at each corner of the inner surfaces of the upper cover and of the lower cover of the reticle pod for ensuring the stability of the photomask stored in the reticle pod and preventing from unnecessary collisions that will lead to displacement or damage of the photomask stored in the reticle pod. In the present invention, some details for manufacturing or processing photomask or reticle pod are achieved by applying conventional art, and therefore are not completely depicted in below description. And the drawings referred to in the following are not made according to the actual related sizes, the function of which is only to express and illustrate characteristics of the present invention.

Figure 1:
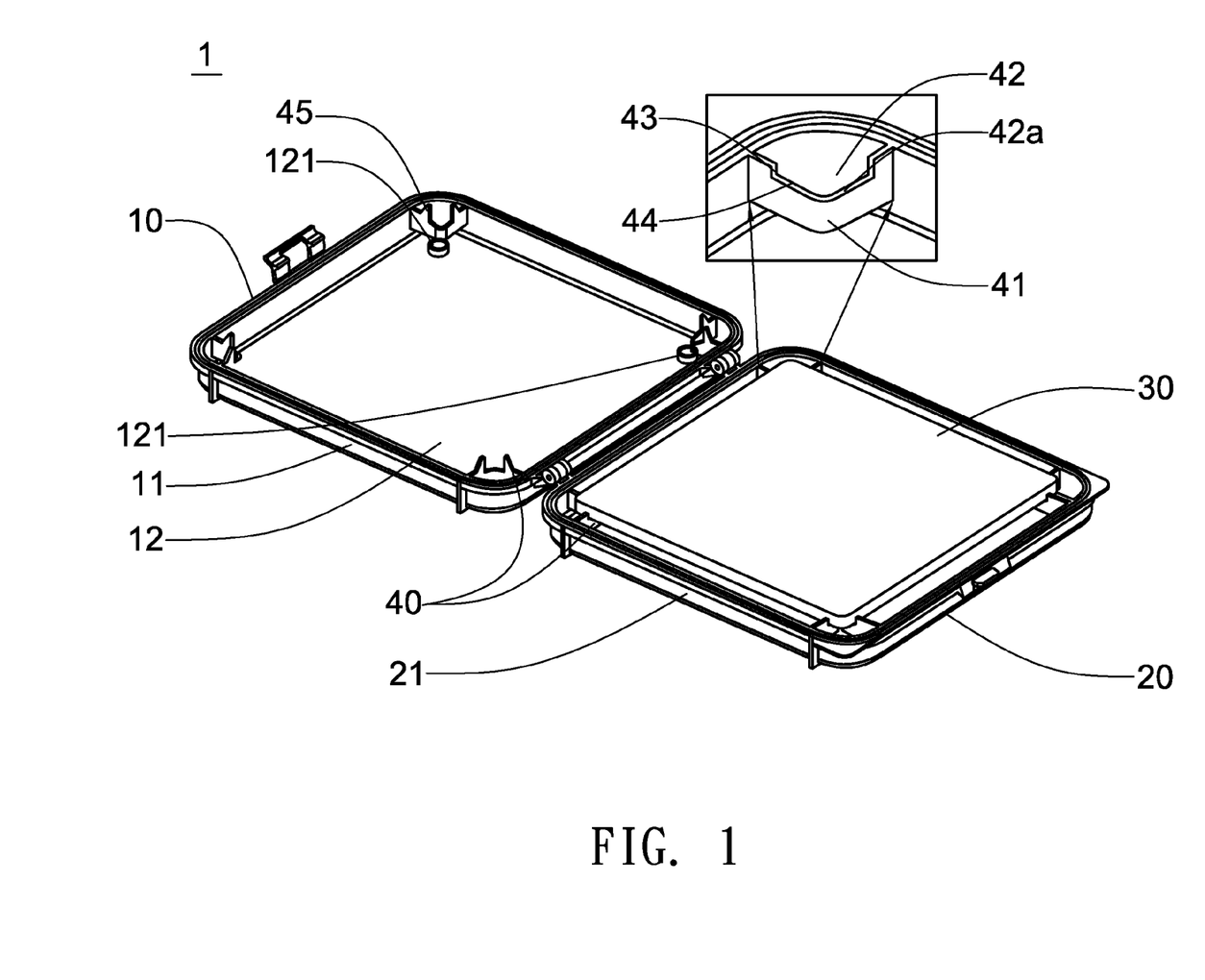
FIG. 1 is a stereogram of reticle pod.

Referring to FIG. 1, which is a view of a preferred embodiment of reticle pod of the present invention. As shown in FIG. 1, a reticle pod 1, comprising an upper cover 10 having a first accommodating space and a lower cover 20 having a second accommodating space, the upper cover 10 and the lower cover 20 having respectively outer surfaces 11 and 21 and inner surfaces 12 and 22, the outer surface 11 of the upper cover 10 having a top cover part 13 and the outer surface 21 of the lower cover 20 having a bottom cover part 23, a third accommodating space being formed after the upper cover 10 and the lower cover 20 closing together, and the top cover part 13 of the upper cover 10 and the bottom cover part 23 of the lower cover 20 corresponding to each other, wherein characteristic of reticle pod 1 is in that: the reticle pod 1 includes a plurality of supporting pieces 40 suspendingly disposed at each corner of the inner surface 12 of the upper cover 10 and the inner surface 22 of the lower cover 20, and two ends of each of the plurality of supporting pieces 40 are respectively connected to two neighboring sides of corners of the inner surfaces 12 and 22 to form a closed sheet body, two opposite ends of the closed sheet body being respectively connected to two sides extending from corners of the inner surface 12 of the upper cover 10 and the inner surface 22 of the lower cover 20, and a bend 41 being formed near central part of the closed sheet body, wherein one side of the central bend 41 of the closed sheet body includes a gap 42.

According to the above description, the gap 42 of the supporting piece 40 forms a symmetrical shape with the central bend 41 as center, and the symmetrical shape can be U-shape, V-shape, or half-polygon shape. The symmetrical shape of supporting piece 40 as disclosed in FIG. 1 is a half-hexagon shape, which is a preferred embodiment of the present invention. Each of the two symmetrical sides of the gap 42 of polygon supporting piece 40 includes a first side 43 and a second side 44, and the first side 43 and the second side 44 can form a slanted surface 42a of about 30-150 degrees. Therefore, when the photomask 30 is placed in the pod, the bottom part of side of the photomask 30 will contact the second side 44 with slanted surface 42a, and the first side 43 will contact the side of the photomask 30; moreover, the left and right opposite sides of the central bend 41 of the supporting piece 40 can form an included angle of about 30-150 degrees. Since the supporting pieces 40 are suspendingly disposed at each corner of the inner surface 12 of the upper cover 10 and the inner surface 22 of the lower cover 20 of the reticle pod 1, a gap is formed between the supporting pieces 40 and the inner surface 12 of the upper cover 10 and the inner surface 22 of the lower cover 20. With this gap design, the supporting pieces 40 are allowed room to have upward and downward displacement and are thus capable of absorbing vibration generated when the reticle pod 1 is transported and providing the photomask 30 with a protective buffering effect. Moreover, in order to prevent the gap between the supporting pieces 40 and the inner surface 12 of the upper cover 10 and the inner surface 22 of the lower cover 20 from being too large and thus causing too much displacement of the supporting pieces 40 that may further lead to imbalance of the photomask 30 or damage of the connecting area between the supporting pieces 40 and the body of reticle pod 1, in the present invention at least a buffer piece 121 is further disposed below the gap between the supporting pieces 40 and the inner surface 12 of the upper cover 10 and the inner surface 22 of the lower cover 20 for adjusting the size of the gap; what is to be described in particular is that, the buffer piece 121 is located below the central bend 41 of the supporting piece 40.

Furthermore, a fin portion 45 can further extend from the side of the supporting piece 40 with gap 42, and the fin portion 45 is symmetrically disposed with the central bend 41 as center; therefore, after the upper cover 10 and the lower cover 20 of the reticle pod 1 close together, the fin portion 45 can contact side of the photomask 30 for increasing the supportive force for the photomask 30 of the supporting piece 40 in lateral direction. To describe further, when all the corresponding locations of the inner surfaces 12 and 22 of the upper cover 10 and the lower cover 20 are disposed with supporting pieces 40, after the upper cover 10 and the lower cover 20 of the reticle pod 1 close together, the fin portion 45 on supporting piece 40 located at the upper cover 10 and the fin portion 45 on supporting piece 40 located at the lower cover 20 will interlockingly contact side of the photomask 30. Therefore, when the reticle pod 1 is in the process of transportation, each corner of the photomask 30 is propped up by two fin portions 45 and thus the supportive force for the photomask 30 of the supporting piece 40 in lateral direction can be considerably increased.

The supporting pieces 40 and the reticle pod 1 of the present invention are integrated in manufacturing process, and thus not only a simpler structure is provided, but the number of pieces is also decreased to reduce time and cost spent in assembling the pieces.

Figure 2A:
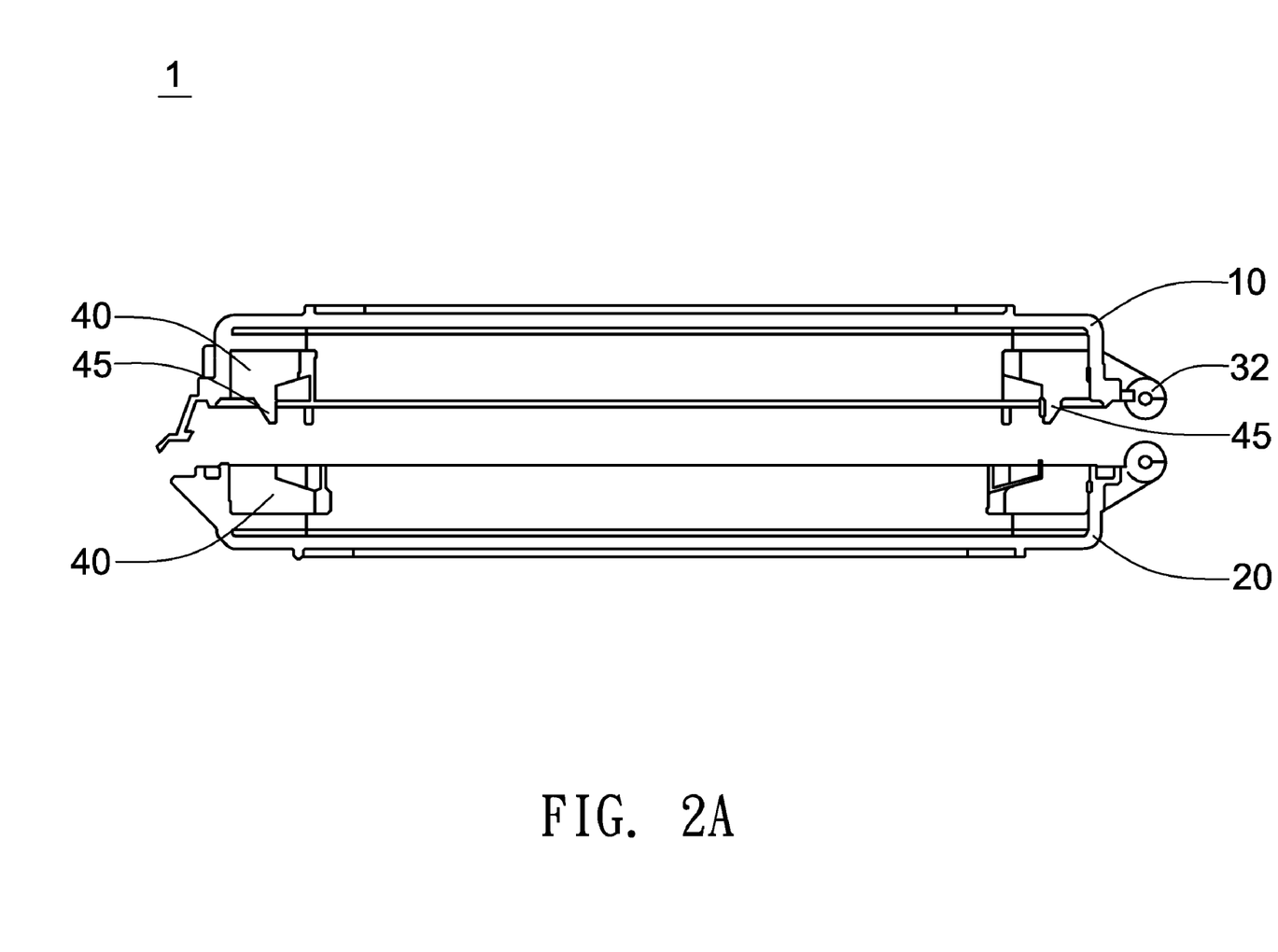
FIG. 2A is a side view of upper cover and lower cover of reticle pod when being separated.
Figure 2B:
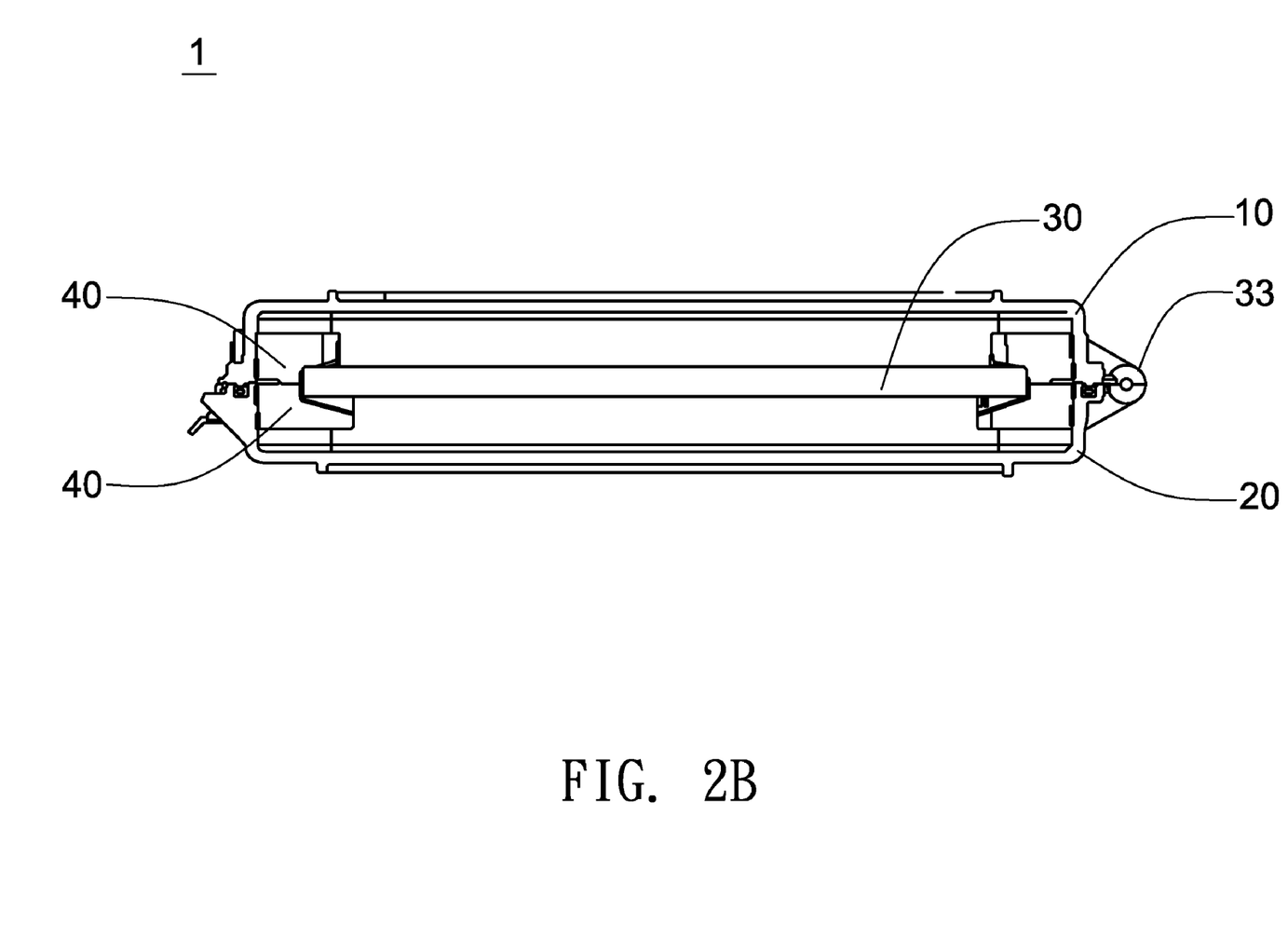
FIG. 2B is a side view of upper cover and lower cover of reticle pod when being joined together.

Referring still to FIG. 1, when the photomask is stored in the third accommodating space of the reticle pod 1, the four corners of the photomask 30 are placed in the gaps of the supporting pieces 40. Then referring to FIG. 2A and FIG. 2B, when the upper cover 10 and the lower cover 20 close together, the supporting pieces 40 prop up to the crest line of the photomask 30 for ensuring the stability of the photomask and preventing from unnecessary collisions that will lead to displacement or damage of the photomask. Moreover, the contact area between the photomask 30 and the supporting pieces 40 is only limited to the area of the crest line, and thus the contact area between the photomask 30 and the supporting pieces 40 can be reduced for preventing the photomask 30 from being damaged.

Figure 3:
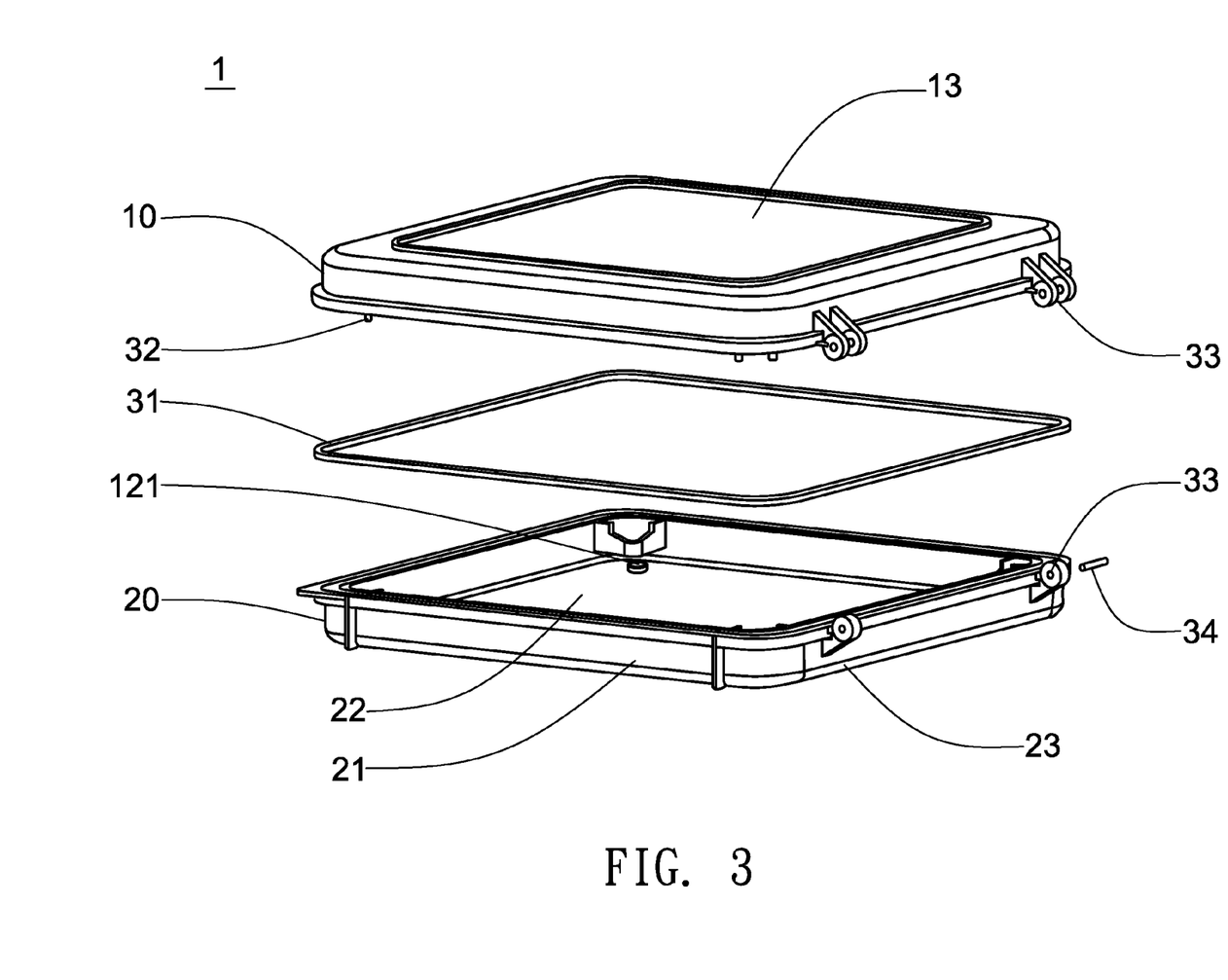
FIG. 3 is an explosive view of upper cover, lower cover, and sealed ring of reticle pod.
Figure 4A:
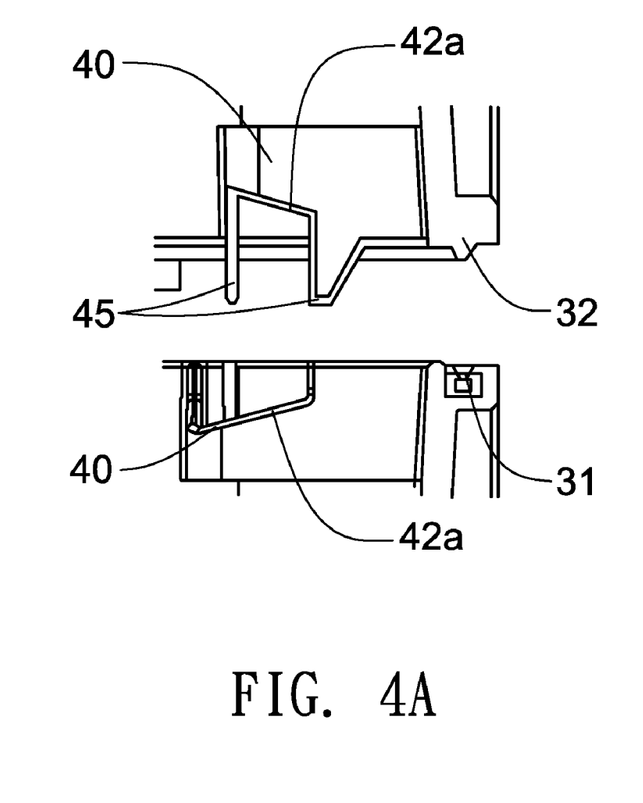
FIG. 4A is a magnified view of part of protruding portion of upper cover and sealed ring of lower cover of reticle pod when being separated.
Figure 4B:
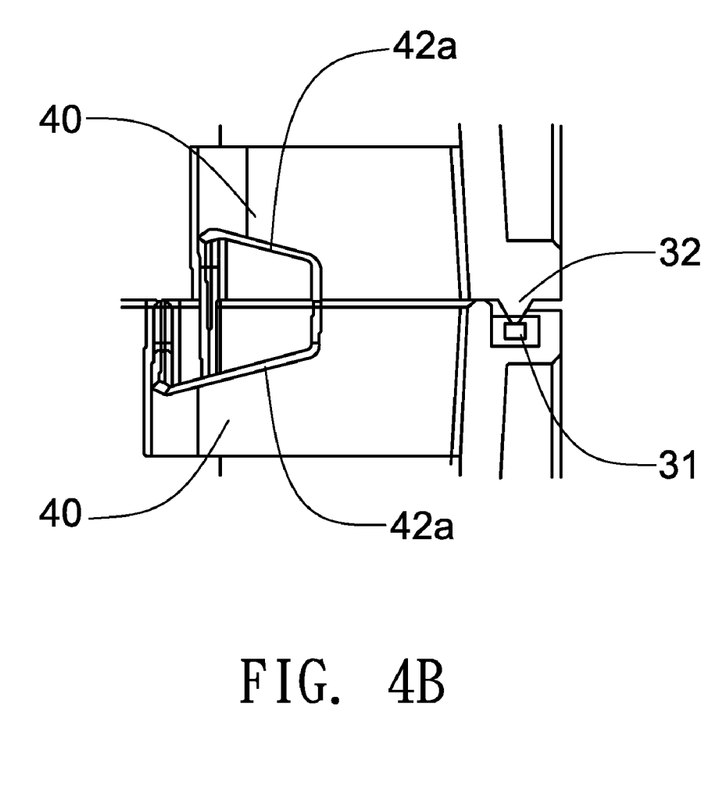
FIG. 4B is a magnified view of part of protruding portion of upper cover and sealed ring of lower cover of reticle pod when being joined together.

Referring to FIG. 3, the reticle pod 1 of the present invention can further comprise a sealed ring 31 disposed at the opening of the first accommodating space of the upper cover 10 or the opening of the second accommodating space of the lower cover 20 for providing the reticle pod 1 with a better effect of air tightness. The sealed ring 31 can be a hollow ring body or a solid ring body, and it can be made of material such as an elastic material (such as rubber). The reticle pod 1 of the present invention can further comprise a protruding portion 32 disposed at the opening of the first accommodating space of the upper cover 10 or the opening of the second accommodating space of the lower cover 20; referring to FIG. 4A and FIG. 4B, when the upper cover 10 and the lower cover 20 close together, the protruding portion 32 will press the sealed ring 31 tight and thus allows the reticle pod 1 to achieve the effect of air tightness.

Referring to FIG. 3, the reticle pod 1 of the present invention can further comprise at least a pair of connection portions 33 respectively disposed on one side of the upper cover 10 and of the lower cover 20, wherein the pair of connection portions are pivotally connected with each other via bolt 34 and the connection portions 33 and the reticle pod 1 are integrated in manufacturing process, and therefore a simpler structure is provided.

Figure 5A:
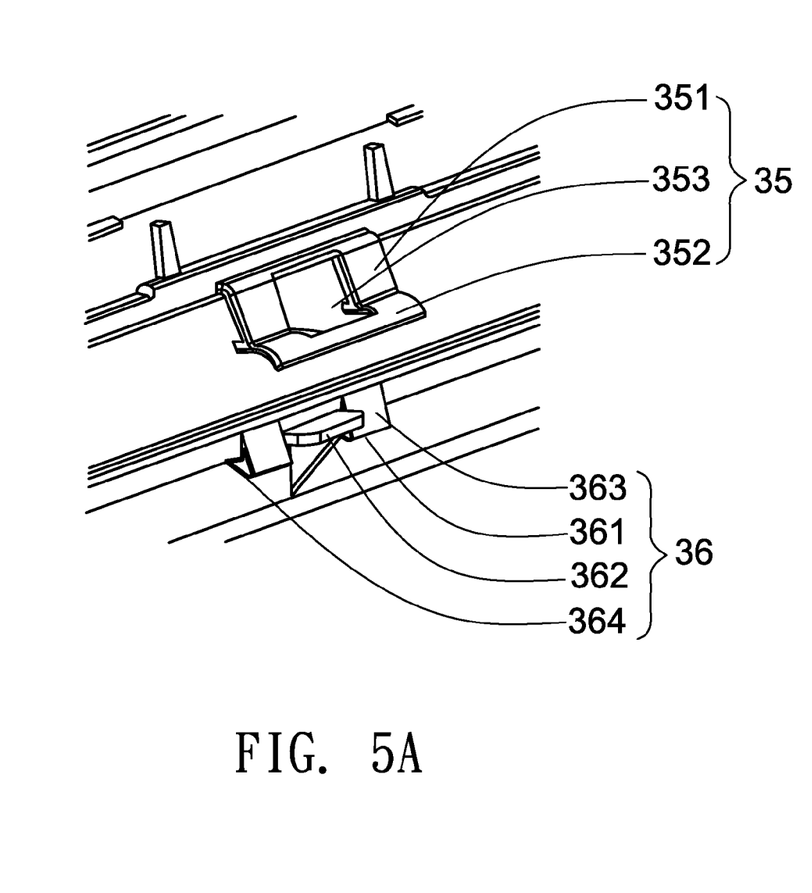
FIG. 5A is a view of upper cover and lower cover of reticle pod with the lock-fastening portion being opened.
Figure 5B:
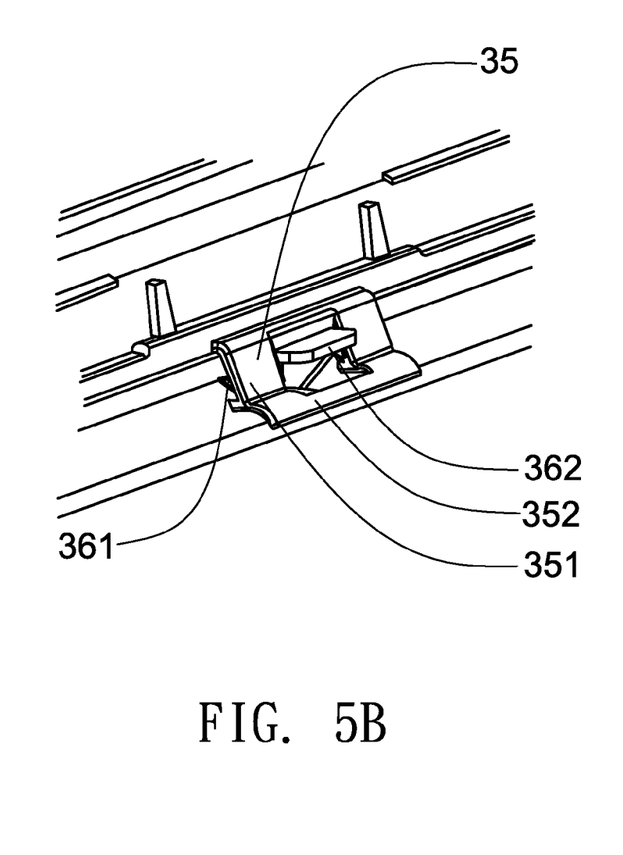
FIG. 5B is a view of upper cover and lower cover of reticle pod with the lock-fastening portion being closed.
Figure 5C:
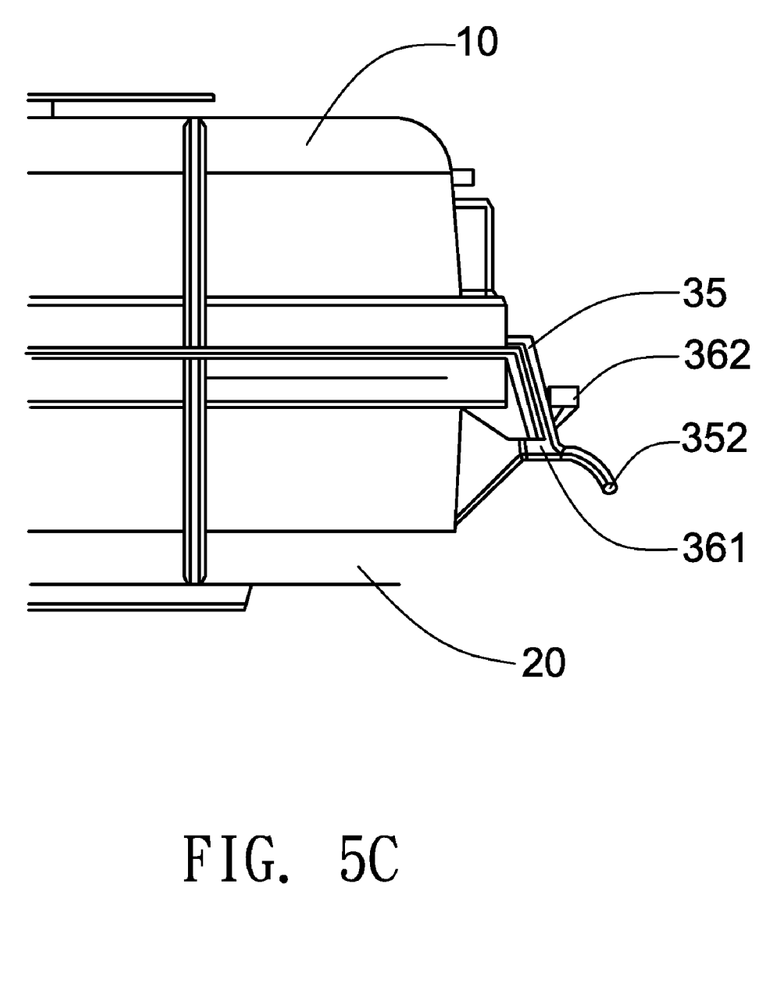
FIG. 5C is a side view of upper cover and lower cover of reticle pod being closed together and lock-fastened.

Referring to FIG. 5A, the reticle pod 1 of the present invention can further comprise at least a pair of lock-fasteners respectively disposed on one side of the upper cover 10 and of the lower cover 20. The lock-fastener includes a first lock-fastening portion 35 disposed on one side of the upper cover 10 and a second lock-fastening portion 36 disposed on one side of the lower cover 20, and the first lock-fastening portion 35, and the second lock-fastening portion 36 are approximately corresponding to each other. The lock-fasteners and the reticle pod 1 are integrated in manufacturing process and therefore the structure is simpler. The first lock-fastening portion 35 includes a first inverse U-shape slanted board 351 and a second inverse U-shape slanted board 352. This inverse U-shape slanted board is formed with three closed sides and one open side. The closed side of the first inverse U-shape slanted board 351 extends from one side of the upper cover 10 toward the direction of the lower cover 20, and intersects vertically with the open side of the second inverse U-shape slanted board 352 approximately in a T shape, and thus a lock-fastening groove 353 can be formed roughly at the intersecting area of the first inverse U-shape slanted board 351 and the second inverse U-shape slanted board 352. The second lock-fastening portion 36 includes a pair of lock-fastening hook portions 361 and a lock-fastening board 362. The lock-fastening board 362 is disposed between the pair of lock-fastening hook portions 361 and approximately intersects vertically with the pair of lock-fastening hook portions 361. The pair of lock-fastening hook portions 361 is roughly a triangular body and one side surface of the triangular body is used to connect with the lower cover 20 and two side surfaces of the triangular body are a first slanted surface 363 and a second slanted surface 364 respectively, the first slanted surface 363 and the lock-fastening board 362 being approximately vertically intersected. Referring to FIG. 5B and FIG. 5C, when the upper cover 10 and the lower cover 20 close together, the lock-fastening board 362 can penetrate the lock-fastening groove 353, and one end of the second inverse U-shape slanted board 352 slides along the first slanted surface 363 of the lock-fastening hook portions 361, allowing the T-shape vertically intersecting area of the first inverse U-shape slanted board 351 and the second inverse U-shape slanted board 352 to clasp the lock-fastening hook portions 361, the first inverse U-shape slanted board 351 to adjoin the first slanted surface 363, and the second inverse U-shape slanted board 352 to adjoin and prop up the second slanted surface 364. The upper cover 10 and the lower cover 20 can thus be tightly adjoined to each other and a lock-fastening function is accomplished; when the reticle pod 1 is to be opened, the lock-fastening board 362 and the second inverse U-shape slanted board 352 can be lightly pressed for the reticle pod 1 to be easily opened with one hand.

Figure 6A:
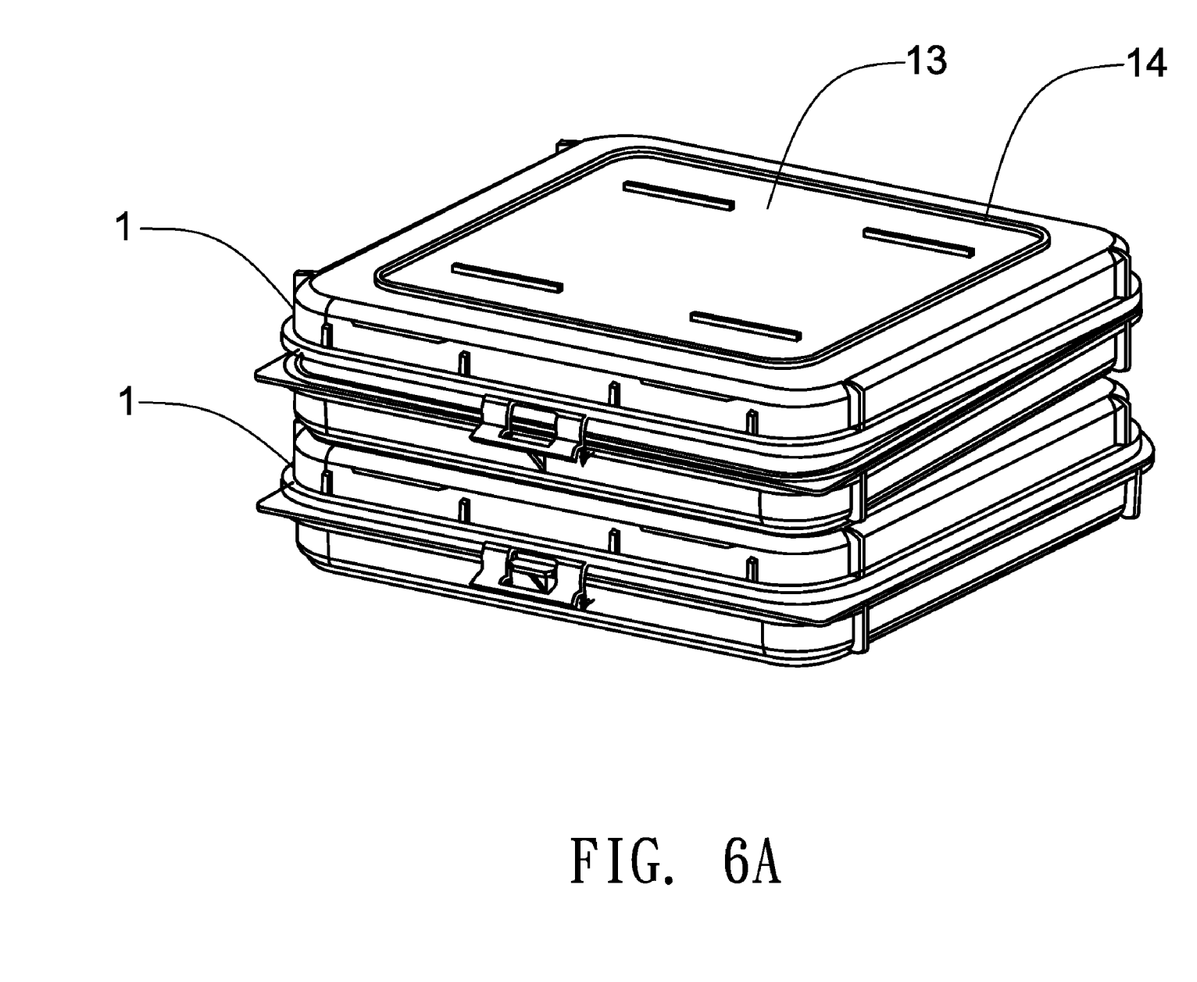
FIG. 6A is a stereogram of upper part of stacked upper cover and lower cover of reticle pod.
Figure 6B:
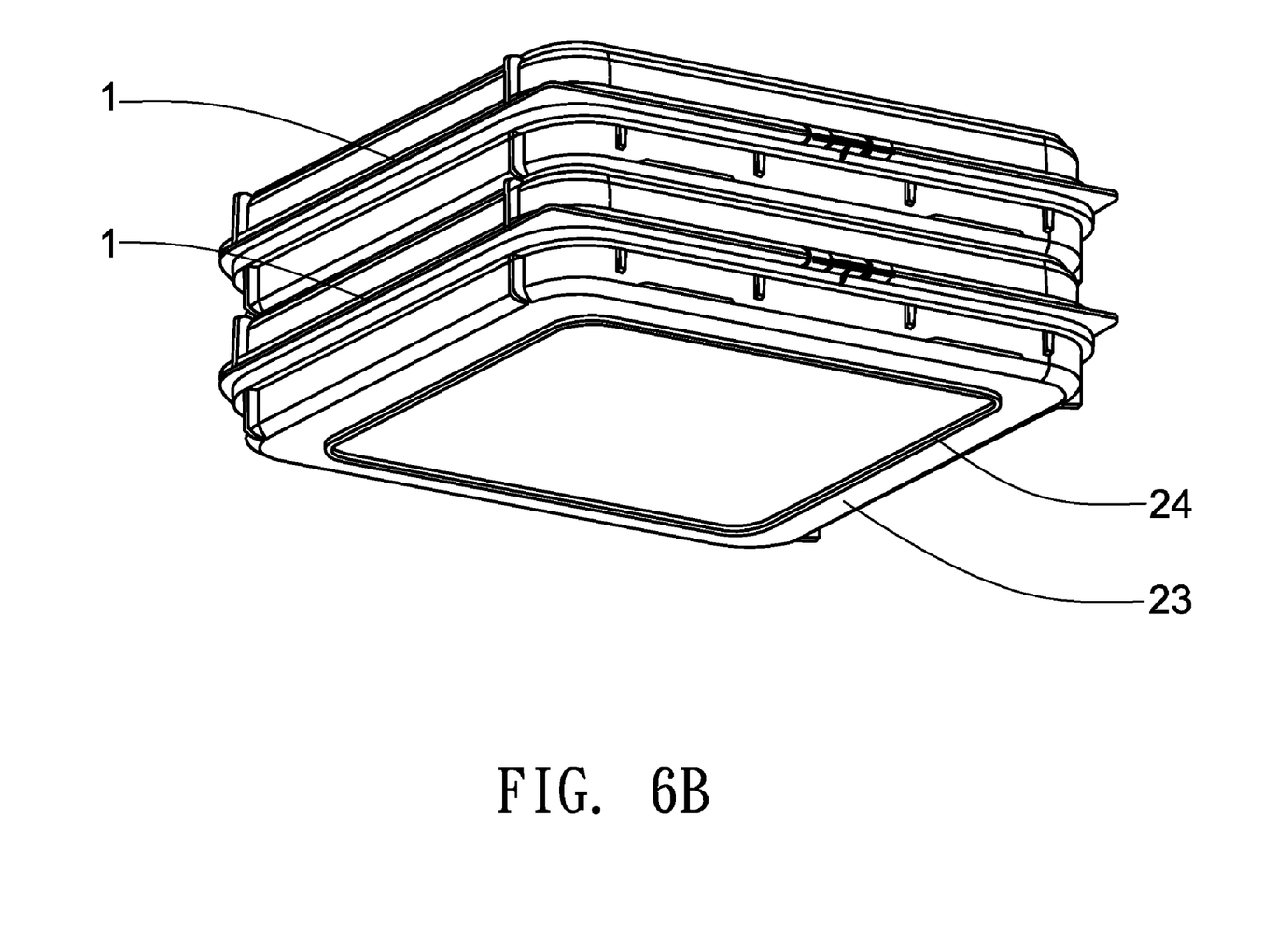
FIG. 6B is a stereogram of lower part of stacked upper cover and lower cover of reticle pod.
Figure 6C:
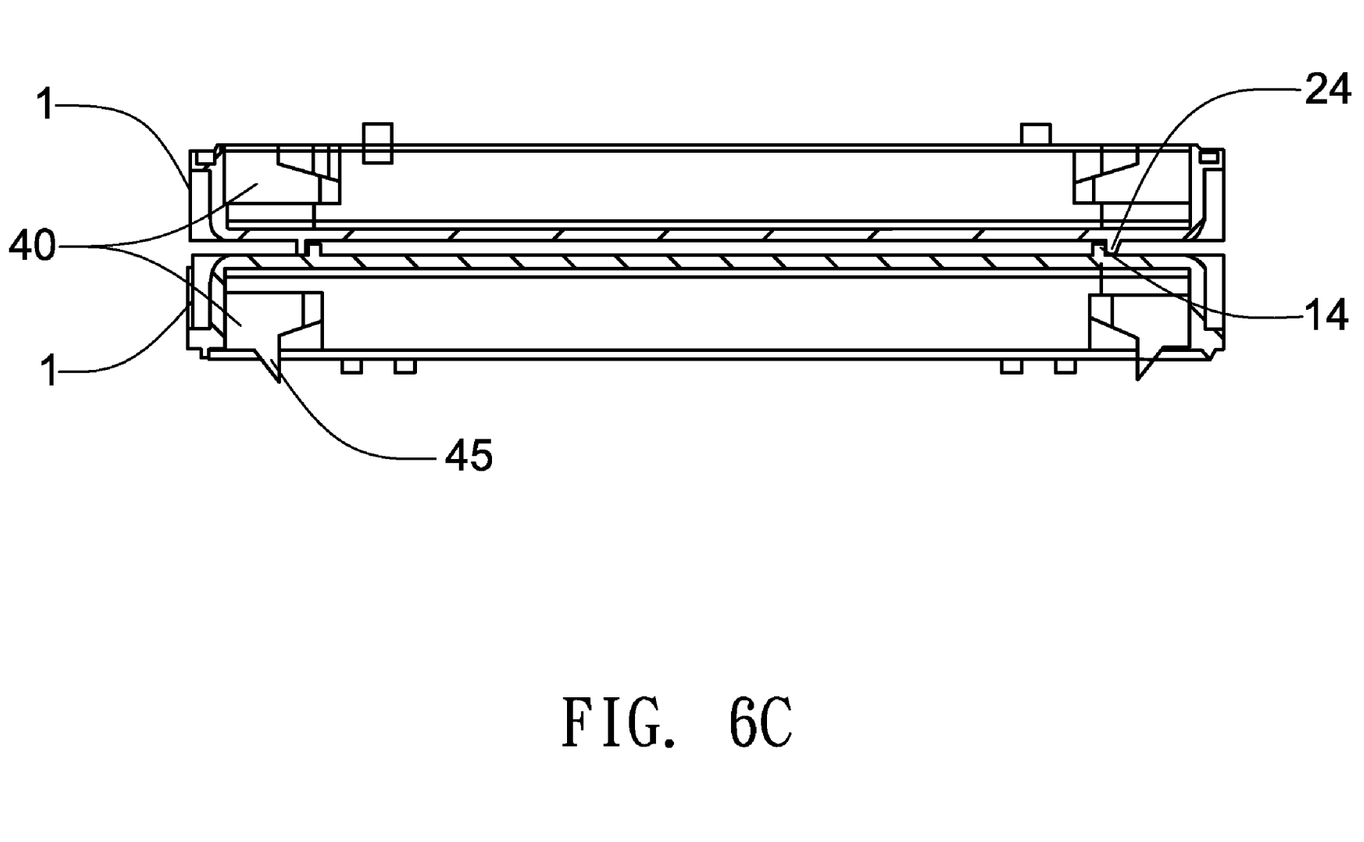
FIG. 6C is a side view of stacked upper cover and lower cover of reticle pod.

Referring to FIG. 6A and FIG. 6B, the reticle pod 1 of the present invention can further comprise at least a first protruding edge 14 and at least a second protruding edge 24, the first protruding edge 14 being disposed at the top cover part 13 of the upper cover 10 (as shown in FIG. 6A) and the second protruding edge 24 being disposed at the bottom cover part 23 of the lower cover 20 (as shown in FIG. 6B), wherein the first protruding edge 14 and the second protruding edge 24 are a ring structure (rectangular shape for example), or disposed in sections at corners of the upper cover 10 or the lower cover 20. Moreover, the size of area encircled by the first protruding edge 14 is not equivalent to the size of area encircled by the second protruding edge 24, and in the preferred embodiment of the present invention, the area encircled by the first protruding edge 14 of the upper cover 10 is smaller than the area encircled by the second protruding edge 24 of the lower cover 20. Then, referring to FIG. 6C, in semiconductor process, in order to make efficient use of space in plant, the reticle pod 1 will be stacked. And with the design of the first protruding edge 14 and the second protruding edge 24 of the present invention, not only is the reticle pod 1 being stackable, but the space needed for storing the reticle pod 1 is also reduced, and the first protruding edge 14 and the second protruding edge 24 can hold up and pin down each other to prevent the stacked reticle pod 1 from slanting or toppling due to collision.

Figure 7:
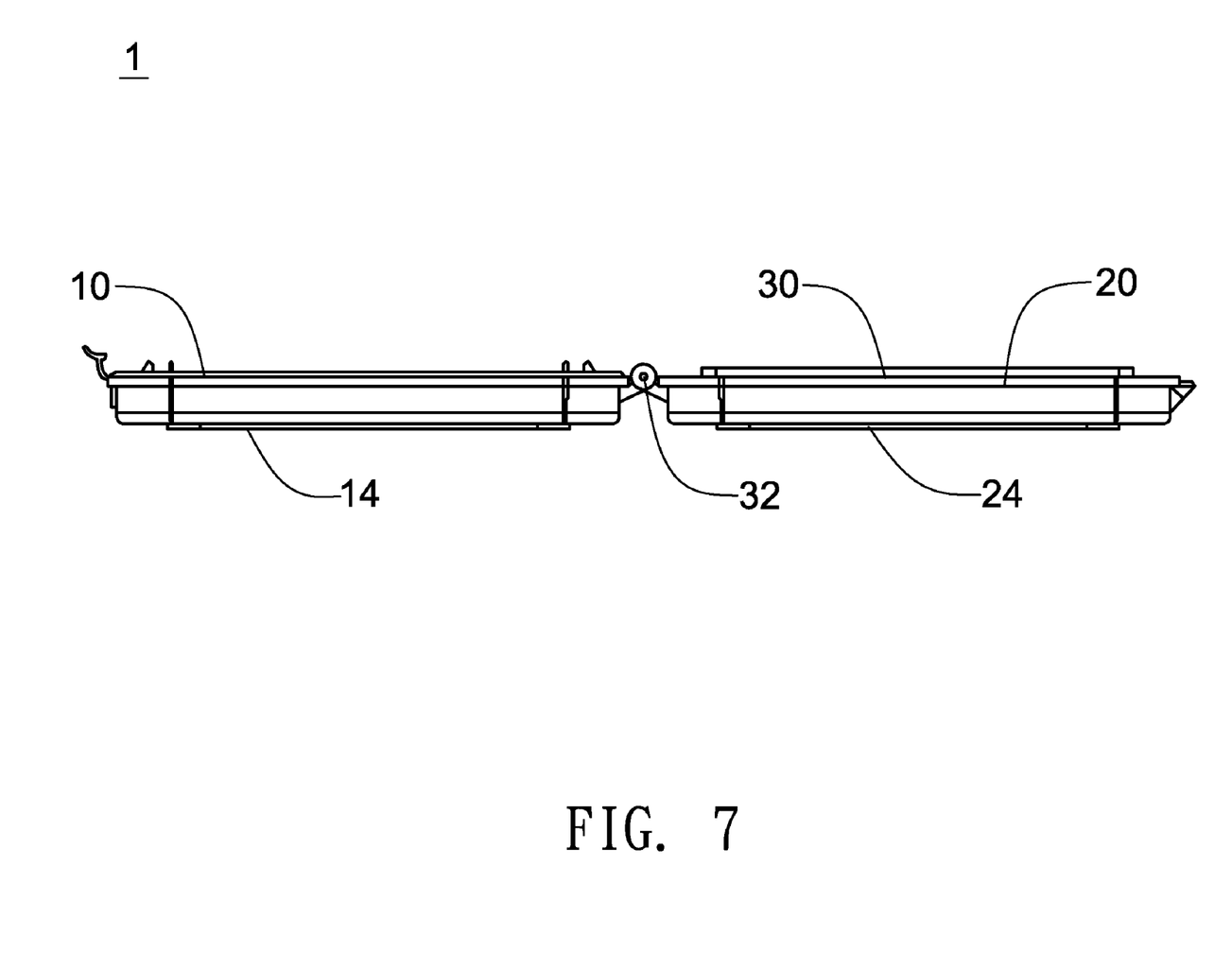
FIG. 7 is a side view of upper cover and lower cover of reticle pod flatly placed.

Referring to FIG. 7, thickness of the upper cover 10 and thickness of the lower cover 20 of the reticle pod 1 of the present invention are about the same, and thickness of the first protruding edge 14 and thickness of the second protruding edge 24 can also be about the same, and therefore the upper cover 10 and the lower cover 20 of the reticle pod 1 can completely lie flat on the surface of table without any single side of the upper cover 10 or the lower cover 20 warping when being spread out and placed on the surface of table, allowing the reticle pod 1 to be stably and flatly placed on the surface of table.

Figure 8A:
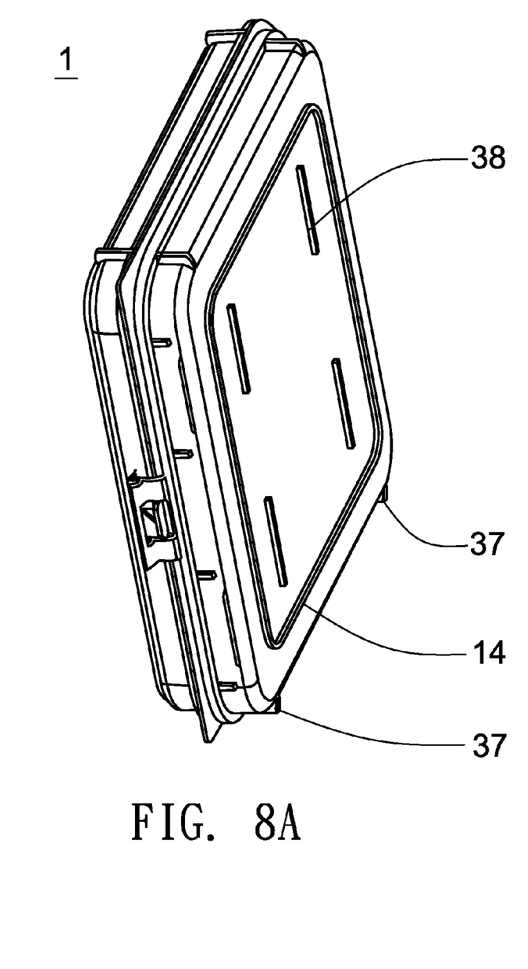
FIG. 8A is a stereogram of upper cover and lower cover of reticle pod when being erectly placed.
Figure 8B:
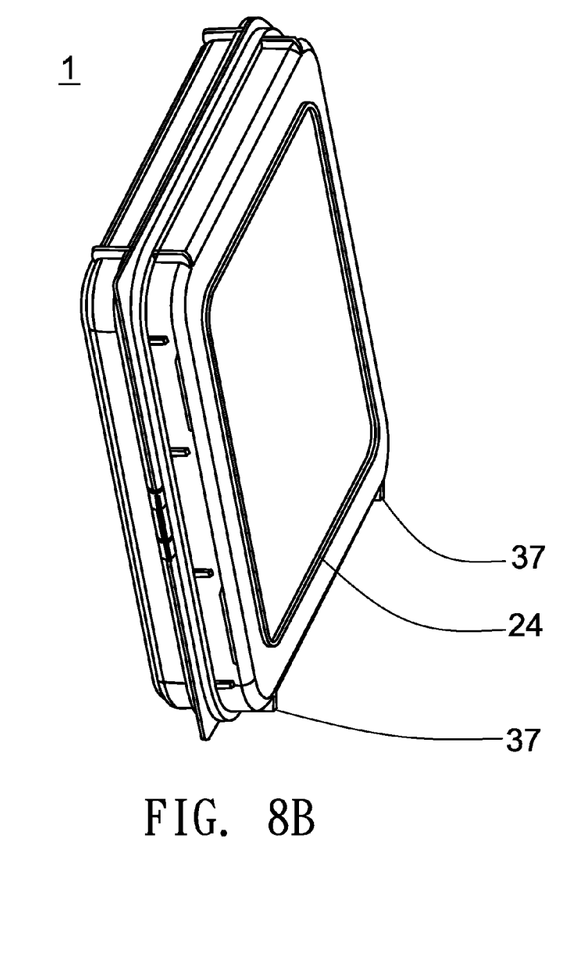
FIG. 8B is a stereogram of upper cover and lower cover of reticle pod when being erectly placed.

Referring to FIG. 8A and FIG. 8B, the reticle pod 1 of the present invention can further comprise at least a pair of foot stands 37 disposed on two opposite symmetrical sides of the outer surfaces 11 and 21 of the reticle pod 1 for the reticle pod 1 to be stably and erectly placed on the surface of table.

Figure 9:
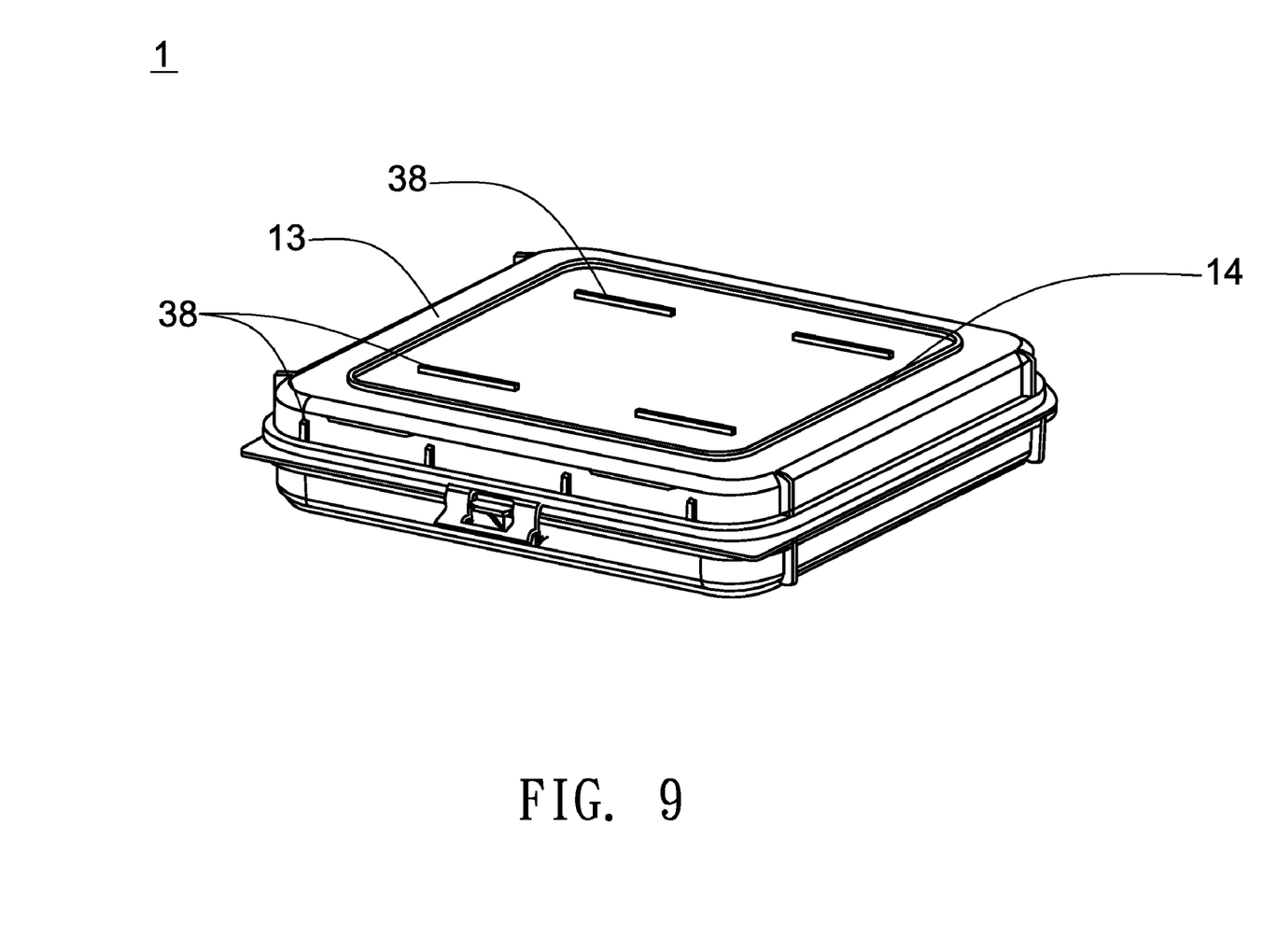
FIG. 9 is a view of barrier of reticle pod.

Referring to FIG. 9, the reticle pod 1 of the present invention can further comprise at least a barrier 38 disposed on the reticle pod 1. The barrier 38 can be disposed in pair on the top cover part 13 of the upper cover 10 of the reticle pod 1 or disposed in inverse U-shape on one side of the upper cover 10 of the reticle pod 1. Wherein the barrier 38 is an L-shape bar structure, and one end of this L-shape bar structure is connected to the reticle pod 1. Therefore when name plate or bar code is placed in the barrier 38, the name plate or bar code can be prevented from dropping if the reticle pod 1 is placed upside down.

Figure 10:
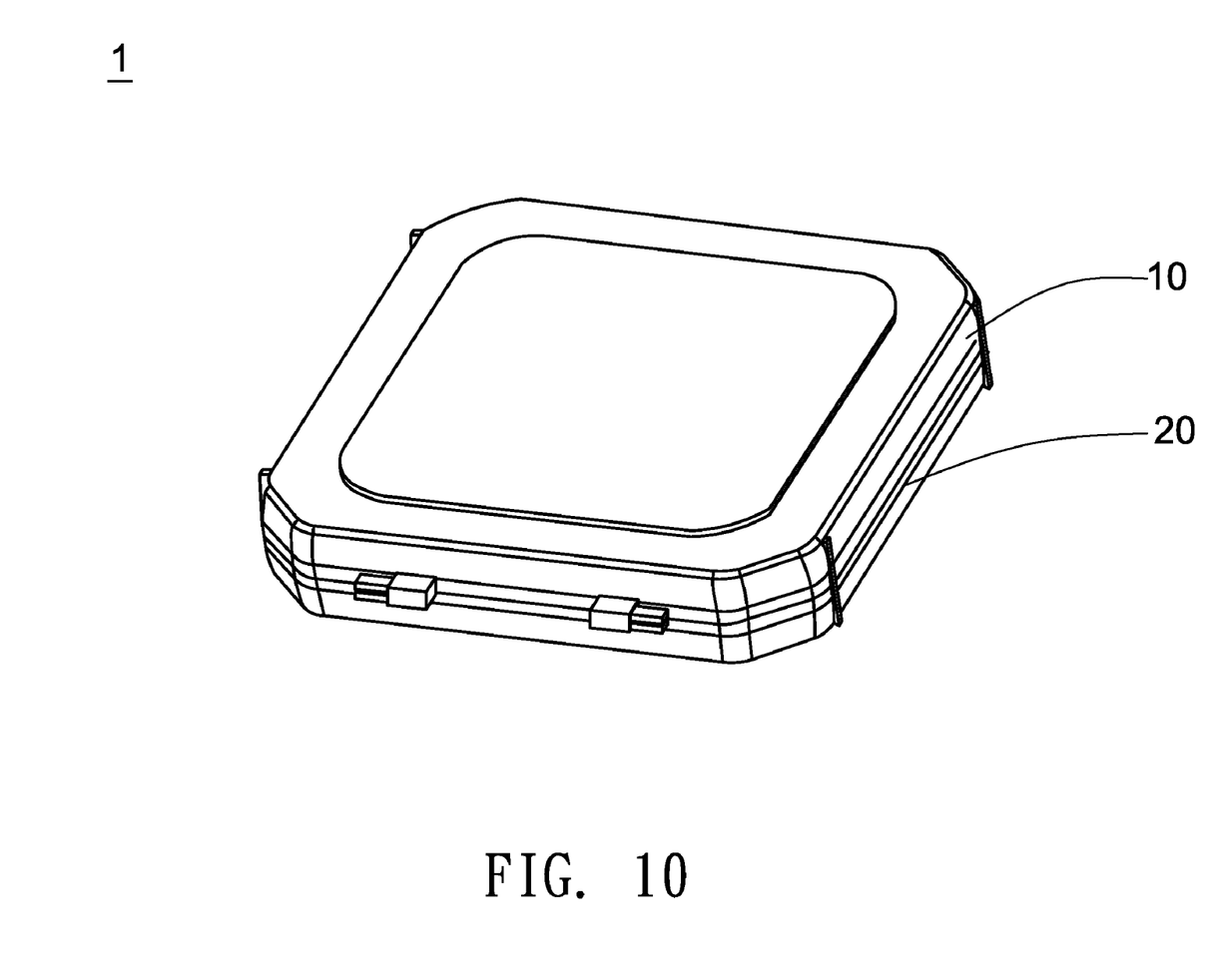
FIG. 10 is a stereogram of reticle pod.

In addition to the above, the shape of the upper cover 10 and the lower cover 20 of the reticle pod 1 of the present invention can be design of quadrilateral cube (as shown in FIG. 1) or octagon cube (as shown in FIG. 10), which are also covered within the scope of the present invention.

What are described above are only preferred embodiments of the present invention and are not for limiting the scope of the present invention; and the above description can be understood and put into practice by those who are skilled in the art. Therefore any equivalent modifications and arrangements made without departing from the spirit disclosed by the present invention should be encompassed by the appended claims accorded with the broadest interpretation.

What is claimed is:

1. A reticle pod, comprising an upper cover having a first accommodating space, a lower cover having a second accommodating space and at least a pair of lock-fastener respectively disposed on one side of said upper cover and said lower cover, said upper cover and said lower cover each having an outer surface and an inner surface, said outer surface of said upper cover having a top cover part and said outer surface of said lower cover having a bottom cover part, a third accommodating space being formed after said upper cover and said lower cover closing together, and said top cover part of said upper cover and said bottom cover part of said lower cover corresponding to each other, wherein the characteristic is in that:

said reticle pod includes a plurality of supporting pieces respectively and suspendingly disposed at each corner of inner surface of said upper cover and said lower cover, two ends of said plurality of supporting pieces being respectively connected to two neighboring sides of corner of said inner surface to form a closed sheet body, said lock-fastener having a first lock-fastening portion and a second lock-fastening portion, said first lock-fastening portion includes a first inverse U-shape slanted board and a second inverse U-shape slanted board, wherein said first lock-fastening portion is disposed on one side of said upper cover, said second lock-fastening portion is disposed on one side of said lower cover, said first lock-fastening portion and said second lock-fastening portion correspond to each other, and closed side of said first inverse U-shape slanted board extending from one side of said upper cover toward direction of said lower cover and approximately intersecting vertically with open side of said second inverse U-shape slanted board in a T-shape.

2. The reticle pod according to claim 1, wherein said supporting pieces and said reticle pod are integrated in manufacturing process.

3. The reticle pod according to claim 1, wherein a gap is formed at bend of said closed sheet body.

4. The reticle pod according to claim 3, wherein said gap of said supporting piece forms a symmetrical shape with said bend as center.

5. The reticle pod according to claim 3, further comprising at least a fin portion extending from a side of said supporting piece with said gap.

6. The reticle pod according to claim 1, further comprising a plurality of buffer pieces, said plurality of buffer pieces being disposed on said inner surfaces of said upper cover and said lower cover, and said plurality of buffer pieces being located below said bend of said closed sheet body.

7. The reticle pod according to claim 1, further comprising a sealed ring disposed at opening of said first accommodating space of said upper cover or opening of said second accommodating space of said lower cover.

8. The reticle pod according to claim 1, further comprising a protruding edge portion disposed at opening of said first accommodating space of said upper cover or opening of said second accommodating space of said lower cover.

9. The reticle pod according to claim 1, wherein a lock-fastening groove is further formed at approximately vertically intersecting area of said first inverse U-shape slanted board and said second inverse U-shape slanted board.

10. The reticle pod according to claim 1, wherein said second lock-fastening portion further includes a pair of lock-fastening hook portions and a lock-fastening board, said lock-fastening board being disposed between said pair of lock-fastening hook portions and vertically intersecting with said pair of lock-fastening hook portions.

11. The reticle pod according to claim 10, wherein said pair of lock-fastening hook portions is a triangular body and one side surface of said triangular body is used to connect with said lower cover.

12. The reticle pod according to claim 11, wherein two side surfaces of said triangular body are respectively a first slanted surface and a second slanted surface, and said first slanted surface and said lock-fastening board are vertically intersected.

13. The reticle pod according to claim 1, further comprising at least a pair of foot stands disposed on two opposite sides of outer surface of said reticle pod.

14. The reticle pod according to claim 1, further comprising at least a barrier disposed on said reticle pod.

15. The reticle pod according to claim 1, wherein shape of cover of said reticle pod can be selected from the group consisting of: quadrilateral cube and octagon cube.

* * * * *